United States Patent [19]

Herrmann

[11] Patent Number: 4,576,426
[45] Date of Patent: Mar. 18, 1986

[54] FLEXIBLE PRINTED CIRCUIT CONNECTOR AND CONTACT EYELET THEREFOR

[75] Inventor: Alan J. Herrmann, Brook Park, Ohio

[73] Assignee: General Motors Corporation, Detroit, Mich.

[21] Appl. No.: 721,997

[22] Filed: Apr. 11, 1985

[51] Int. Cl.⁴ .............................................. H01R 9/07
[52] U.S. Cl. ................................. 339/17 F; 339/17 C; 339/97 C
[58] Field of Search ................. 339/17 R, 17 C, 17 F, 339/97 R, 97 C, 220 R, 220 C, 220 L

[56] References Cited

U.S. PATENT DOCUMENTS

| | | | |
|---|---|---|---|
| 3,197,729 | 7/1965 | Sarazen | 339/97 |
| 3,675,180 | 7/1972 | Podmore | 339/17 F |
| 3,699,495 | 10/1972 | Raynor | 339/17 C |
| 3,701,964 | 10/1972 | Cronin | 339/17 F |
| 3,768,062 | 10/1973 | Michaels | 339/17 C |
| 3,840,840 | 10/1974 | Worth | 339/99 R |
| 3,845,456 | 10/1974 | Michaels | 339/97 R |
| 3,999,826 | 12/1976 | Yurtin | 339/17 F |
| 4,116,517 | 9/1978 | Selvin | 339/17 F |
| 4,175,816 | 11/1979 | Burr et al. | 339/95 R |

*Primary Examiner*—Neil Abrams
*Attorney, Agent, or Firm*—F. J. Fodale

[57] ABSTRACT

A flexible printed circuit connector comprises a stabilizer plate and a flexible printed circuit which have a corresponding pattern of holes which receive contact eyelets which attach the flexible printed circuit to the stabilizer plate. The contact eyelets comprise a tubular body having a flange at one end with depending crimp ears at the rim of the flange which pierce through and extend inwardly to clamp the flexible printed circuit against the flange, and depending crimp ears at the opposite end of the tubular body which extend outwardly to clamp the stabilizer plate and the flexible printed circuit against the flange. The stabilizer plate and the contact eyelets are configured for simultaneously crimping all crimp ears of each eyelet.

8 Claims, 7 Drawing Figures

FLEXIBLE PRINTED CIRCUIT CONNECTOR AND CONTACT EYELET THEREFOR

This invention relates generally to flexible printed circuit connectors and more particularly to flexible printed circuit connectors which have contact eyelets which are crimped or clinched to the flexible printed circuit.

Flexible printed circuits are conventionally connected to electrical devices having male terminals by contact eyelets which are crimped or clinched to the flexible printed circuit, for example, as illustrated in U.S. Pat. Nos. 3,768,062 and 3,845,456 granted to Leonard H. Michaels on Oct. 23, 1973 and Oct. 29, 1974, respectively.

This conventional prior art practice results in a flexible plug-on connector for the flexible printed circuit which is difficult to connect to the male terminals particularly in out-of-the-way and blind assembly situations. Another drawback of the flexible plug-on connector is that the electrical connections between the contact eyelets and the contact pads of the flexible printed circuit are subjected to the forces generated by plugging the connector on the male terminals. Moreover, after plug-on, the electrical connections are subjected to any tension forces which are applied to the flexible printed circuit.

The object of this invention is to provide a rigid plug-on connector for flexible printed circuits which is simple in construction and which overcomes one or more of the aforementioned drawbacks of flexible plug-on connectors.

A feature of the invention is that the electrical connector includes a rigid stabilizer plate to facilitate plugging the flexible printed circuit connector onto mating male terminals and to isolate the electrical connections between the contact eyelets and the contact pads of the flexible printed circuit from the forces generated during the plug-on assembly.

Another feature of the invention is that the rigid stabilizer plate facilitates the incoporation of strain relief means to protect the electrical connections between the contact eyelets and the contact pads of the flexible printed circuit from the tension forces applied to the flexible printed circuit.

Yet another feature of the invention is the use of contact eyelets which are adapted for attachment to a flexible printed circuit and to a rigid stabilizer plate to provide a rigid plug-on connector for the flexible printed circuit.

Yet another feature of the invention is that the contact eyelet and the rigid stabilizer plate are configured for simultaneous attachment of the contact eyelet to the flexible printed circuit and the rigid stabilizer plate.

Other objects and features of the invention will become apparent to those skilled in the art as the disclosure is made in the following detailed description of a preferred embodiment of the invention as illustrated in the accompanying sheets of drawings in which.

Figure 1:
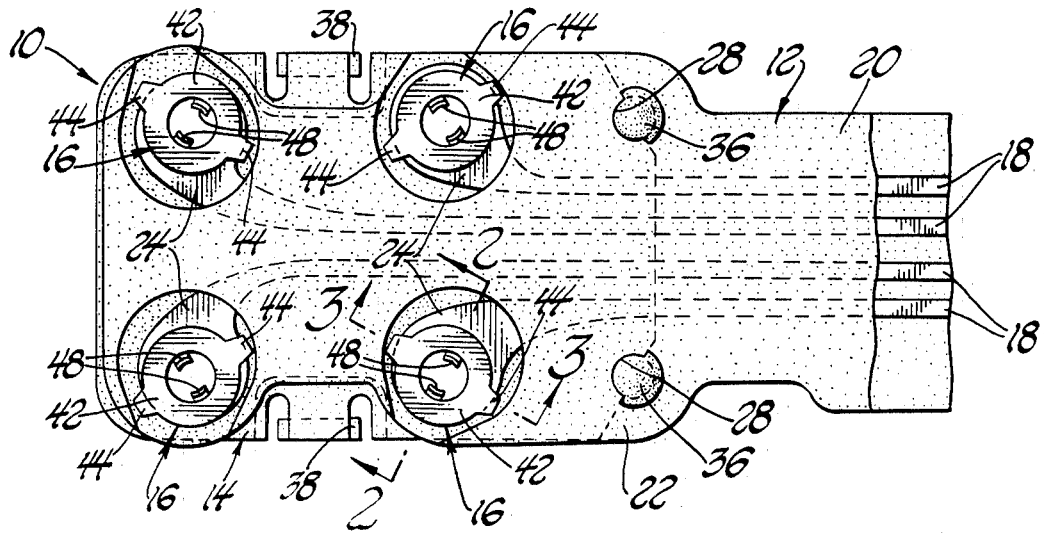
FIG. 1 is a plan view of an electrical connector for a flexible printed circuit in accordance with this invention.

Referring now to the drawing, a rigid plug-on connector for a flexible printed circuit in accordance with this invention is indicated generally at 10. It comprises a tab portion of a flexible printed circuit 12, a rigid nonconductive stabilizer plate 14 and a plurality of contact eyelets 16.

The flexible printed circuit 12 comprises a plurality of conductor strips 18 of thin copper or the like embedded in a flexible insulation 20 of material such as Mylar ®. The flexible printed circuit 12 has a tab portion 22 containing contact pads 24 for each of the conductor strips 18. Portions of the insulation 20 are removed so that an upper surface of each contact pad 24 is exposed.

The tab portion 22 has four circular holes 26 extending through the flexible printed circuit 12 and the respective contact pads 24. The tab portion 22 also has two locator holes 28 extending therethrough.

Figure 6:
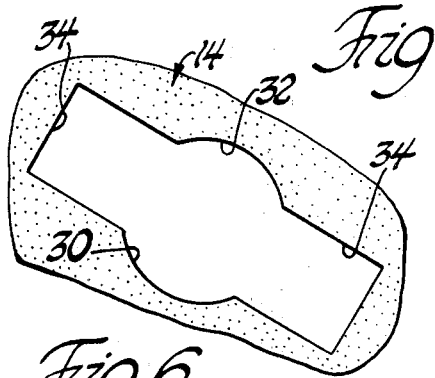
FIG. 6 is a plan view of a portion of the stabilizer plate taken substantially along the line 6—6 of FIG. 4.

The stabilizer plate 14 has four spoked holes 30 extending therethrough which are arranged in the same pattern as the circular holes 26 of the flexible printed circuit 12. The spoked holes 30 each comprise a round central region 32 and a plurality of radial slots 34 which extend from the central region 32 in spoke-like fashion as best shown in FIG. 6. The stabilizer plate 14 also has two upstanding pegs 36 at one end and a depending latch arm 38 at the middle of each side edge.

Figure 4:
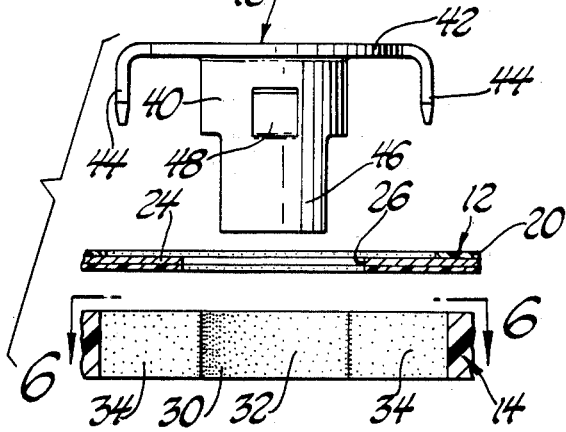
FIG. 4 is an exploded view similar to FIG. 3 showing the various elements of the connector prior to assembly.
Figure 7:
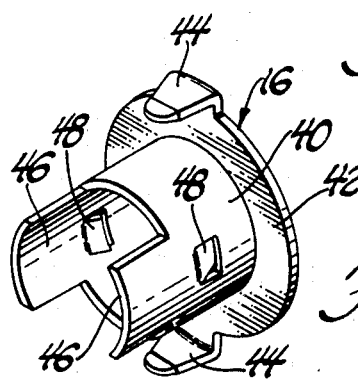
FIG. 7 is a perspective view of the contact eyelet shown in FIGS. 1 through 5.

A typical contact eyelet 16 is shown prior to assembly in FIGS. 4 and 7. The eyelet 16 comprises a tubular body 40 which has an outward annular flange 42 at one end and a pair of diametrically opposed depending crimp ears 44 at the rim of the flange 42. The crimp ears 44 have sharp rounded tips for piercing the flexible printed circuit 12 as will hereinafter more fully appear.

The contact eyelet 16 also has a pair of diametrically opposed crimp ears 46 at the opposite end of the tubular body 40 from the flange 42. The crimp ears 46 are arcuate extensions of the tubular body 40 and they are orthogonally arranged with respect to the crimp ears 44. That is, the crimp ears 46 are located between the crimp ears 44 in the circumferential direction so that the crimp ears 44 and 46 can be bent at the same time. The tubular body 40 may also include lanced contact fingers 48 which are bent inwardly to biasingly engage a male pin (not shown) inserted into the tubular body 40.

The plug-on connector 10 is assembled as follows:

The tab portion 22 of the flexible printed circuit 12 is placed on top of the stabilizer plate 14 and located by the pegs 36 and locator holes 28 so that the circular holes 26 are aligned with the central regions 32 of the spoked holes 30 of the stabilizer plate 14.

Figure 2:
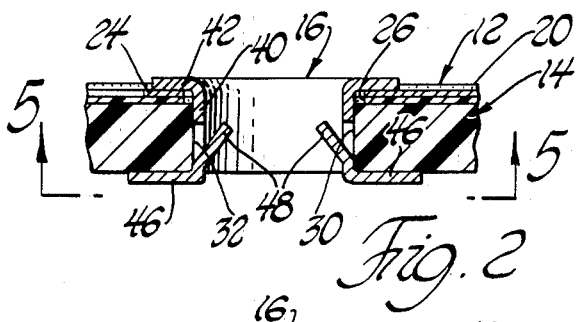
FIG. 2 is a section view taken substantially along the line 2—2 of FIG. 1 looking in the direction of the arrows.
Figure 3:
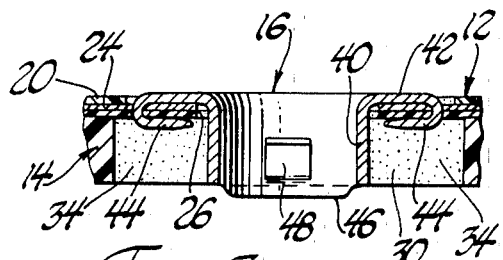
FIG. 3 is a section view taken substantially along the line 3—3 of FIG. 1 looking in the direction of the arrows.
Figure 5:
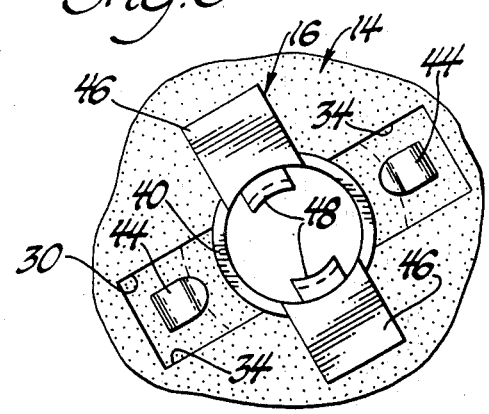
FIG. 5 is a bottom view taken substantially along the line 5—5 of FIG. 2 looking in the direction of the arrows.

A contact eyelet 16 is then inserted into the concave central region 32 of each spoked hole 30 of the stabilizer plate 14 through its associated hole 26 of the flexible printed circuit 12 until the flange 42 engages the exposed surface of the associated contact pad 24. During insertion, the concave central region 32 locates the tubular body 40 in the lateral direction and the depending ears 44 pierce through the flexible printed circuit 12 and enter the spoke-like slots 34 on either side of the central region 32. After insertion, the ears 44 are bent inwardly to engage the underside of the flexible printed circuit 12 and press the flange 42 into good electrical contact with the contact pad 24 as shown in FIGS. 3 and 5. The depending ears 46 are also bent radially outwardly to grip the underside of the stabilizer plate 14 in the areas between the spoke-like slots 34 to clamp the tab portion 22 of the flexible printed circuit 12 and the stabilizer plate 14 together between the flange 42 and the bent ears 46 as shown in FIGS. 2 and 5.

The pegs 36 may be headed before or after the contact eyelets 16 are assembled to provide a strain relief.

It should be noted that the spoke-like slots 34 provide access for tooling to bend or crimp the depending ears 44 and that the crimped ears 44 are out of the way beneath the flexible printed circuit 12. It should also be noted that the spoke-like slots 34 and the arrangement of the crimp ears 44 between the crimp ears 46 in the circumferential direction permits the simultaneous bending of the crimp ears 44 and 46.

I wish it to be understood that we do not desire to be limited to the exact details of construction shown and described, for obvious modifications will occur to a person skilled in the art.

The embodiments of the invention in which an exclusive property of privilege is claimed are defined as follows:

1. A flexible printed circuit connector comprising;
    a stabilizer plate which has a hole extending therethrough,
    a flexible printed circuit which has a contact pad and a hole which extends through the flexible printed circuit and the contact pad,
    the flexible printed circuit having an underside which overlays the stabilizer plate so that the hole which extends through the flexible printed circuit and the contact pad aligns with the hole which extends through the stabilizer plate, and
    a contact eyelet for attaching the flexible printed circuit to the stabilizer plate comprising;
    a tubular body which is disposed in the aligned holes of the flexible printed circuit and the stabilizer plate,
    a flange at one end of the tubular body which engages the flexible printed circuit,
    a plurality of depending crimp ears at the rim of the flange which pierce through the flexible printed circuit and extend inwardly to press portions of the flexible printed circuit against the flange, and
    a second plurality of crimp ears at the opposite end of the tubular body which extend outwardly and engage the underside of the stabilizer plate to clamp the stabilizer plate between the second plurality of crimp ears and the flange.

2. A flexible printed circuit connector comprising;
    a stabilizer plate which has a hole extending therethrough,
    a flexible printed circuit which has a contact pad and a hole which extends through the flexible printed circuit and the contact pad,
    the flexible printed circuit having an underside which overlays the stabilizer plate so that the hole which extends through the flexible printed circuit and the contact pad aligns with the hole which extends through the stabilizer plate, and
    a contact eyelet for attaching the flexible printed circuit to the stabilizer plate comprising;
    a tubular body which is disposed in the aligned holes of the flexible printed circuit and of the stabilizer plate,
    a flange at one end of the tubular body which engages an upper surface of the flexible printed circuit,
    a plurality of depending crimp ears at the rim of the flange which pierce through the flexible printed circuit and extend inwardly to engage the underside of the flexible printed circuit and press portions of the flexible printed circuit against the flange, and
    a second plurality of crimp ears at the opposite end of the tubular body which extend outwardly and engage the underside of the stabilizer plate to clamp the flexible printed circuit and the stabilizer plate against the flange.

3. The flexible printed circuit connector as defined in claim 2 wherein the hole of the stabilizer plate has a concave central region for retaining the tubular body of the contact eyelet in the lateral direction and a plurality of spoke-like slots which extend from the central region to accommodate the plurality of depending crimp ears at the rim of the flange.

4. The flexible printed circuit connector as defined in claim 3 wherein the depending crimp ears at the rim of the flange are located between the depending crimp ears at the opposite end of the tubular body in the circumferential direction so that all of the crimp ears can be bent simultaneously.

5. The flexible printed circuit connector as defined in claim 3 wherein the plurality of crimp ears at the rim of the flange consists of second two diametrically opposed ears and the plurality of crimp ears at the opposite end of the tubular body consist of two diametrically opposed crimp ears which are orthogonally related to the two diametrically opposed crimp ears at the rim of the flange.

6. A flexible printed circuit connector comprising;
    a nonconductive stabilizer plate which has a spoked hole extending therethrough which has a central region and a plurality of slots extending radially from the central region,
    a flexible printed circuit which has a conductive contact pad and a circular hole which extends through the flexible printed circuit and the contact pad,
    the flexible printed circuit having an upper side which includes an exposed surface of the contact pad and an underside which overlays the stabilizer plate so that the circular hole of the flexible printed circuit and the contact pad aligns with the central region of the spoked hole which extends through the stabilizer plate, and
    a contact eyelet for attaching the flexible printed circuit to the stabilizer plate comprising;
    a tubular body which is disposed in the hole of the flexible printed circuit and the central region of the spoked hole of the stabilizer plate,
    a flange at one end of the tubular body which engages the exposed surface of the contact pad,
    a plurality of depending crimp ears at the rim of the flange which pierce through the flexible printed circuit and extend inwardly engaging underside portions of the flexible printed circuit which overlie the slots of the spoked hole and clamping the contact pad against the flange, and a second plurality of crimp ears at the opposite end of the tubular body which extend outwardly and engage underside portions of the stabilizer plate which are between the slots of the spoked hole to clamp the flexible printed circuit and the stabilizer plate against the flange, the crimp ears at the opposite end of the tubular body being located between the crimp ears at the rim of the flange in the circumferential direction so that all of the crimp ears can be crimped simultaneously.

7. A contact eyelet for attaching a flexible printed circuit to a stabilizer plate or the like comprising;

a tubular body which has a flange at one end for engaging a surface of a flexible printed circuit, a plurality of depending crimp ears at the rim of the flange for piercing through the flexible printed circuit and which are bendable inwardly for engaging an opposite surface of the flexible printed circuit to clamp the flexible printed circuit against the flange, and a second plurality of crimp ears at the opposite end of the tubular body which are bendable outwardly for engaging a stabilizer plate and clamping it between the second plurality of crimp ears and the flange.

8. A contact eyelet for attaching a flexible printed circuit to a stabilizer plate or the like comprising;

a tubular body which has a flange at one end for engaging an upper surface of a flexible printed circuit which overlays a stabilizer plate, a pair of diametrically opposed depending crimp ears at the rim of the flange for piercing through the flexible printed circuit and which are bendable inwardly for engaging underside portions of the flexible printed circuit to clamp the flexible printed circuit against the flange, and a second pair of diametrically opposed crimp ears at the opposite end of the tubular body which are bendable outwardly for engaging underside portions of the stabilizer plate, the pair of crimp ears at the opposite end of the tubular body being orthogonally related to the pair of crimp ears at the rim of the flange and respectively located therebetween in the circumferential direction so that all of the crimp ears can be crimped simultaneously.

* * * * *